United States Patent [19]

Boon et al.

[11] Patent Number: 4,835,727
[45] Date of Patent: May 30, 1989

[54] FIELD DEFLECTION CIRCUIT IN A PICTURE DISPLAY DEVICE

[75] Inventors: Cornelis A. M. Boon, The Hague; Arnoldus J. J. Boudewijns, Eindhoven, both of Netherlands

[73] Assignee: U.S. Philips Corporation, New York, N.Y.

[21] Appl. No.: 107,074

[22] Filed: Oct. 8, 1987

[30] Foreign Application Priority Data

Oct. 17, 1986 [NL] Netherlands ............... 8602607

[51] Int. Cl.⁴ ............................................. G06G 7/26
[52] U.S. Cl. ...................................... 364/858; 364/855; 315/370
[58] Field of Search .................. 315/364, 370, 371; 328/186, 187; 364/855, 858, 862

[56] References Cited

U.S. PATENT DOCUMENTS

| | | | |
|---|---|---|---|
| 3,422,363 | 1/1969 | Foote et al. | 328/186 |
| 4,064,406 | 12/1977 | Tiemeijer | 364/858 X |
| 4,501,996 | 2/1985 | Yanuguchi | 315/371 |
| 4,739,228 | 4/1988 | Viscardi et al. | 315/370 X |

OTHER PUBLICATIONS

Cole et al., "Synchronized Saw-Tooth Generator", IBM Tech. Disc. Bull., vol. 23, No. 3, Aug. 1980, pp. 1246-1247.

Primary Examiner—Steven Mottola
Attorney, Agent, or Firm—Edward W. Goodman

[57] ABSTRACT

A field deflection circuit in a picture display device having a sawtooth generator provided with a storage element, for example a capacitor, a first device for causing the quantity of information stored in the storage element to change in one direction during a first part of a field period, and a second device for causing the quantity to change in the opposite direction during a remaining second part of the field period so that an essentially sawtooth-shaped variation is produced. The sawtooth generator is also provided with a control loop for rendering a mean value of the change during the second part of the field period equal to a mean value of the change during the first part of the field period.

8 Claims, 3 Drawing Sheets

FIELD DEFLECTION CIRCUIT IN A PICTURE DISPLAY DEVICE

BACKGROUND OF THE INVENTION

1. Field of the Invention

The invention relates to a circuit for the field deflection in a picture display device, comprising a generator for generating an essentially sawtooth-shaped variation, a power amplifier coupled to the generator and a field deflection coil connected to an output of the amplifier, the sawtooth generator being provided with a storage element, first means for causing a change of the quantity of information stored in the storage element in one direction during a first part of a field period, and second means for causing a change of the quantity of stored information in the opposite direction during a remaining second part of the field period so that the essentially sawtooth-shaped variation is produced.

2. Description of Related Art

A circuit of this type is generally known and is frequently used in picture display devices. In this circuit, the sawtooth-shaped variation is obtained in that a capacitor is successively charged and discharged. The change of the charge present in the capacitor in a given direction, for example, during discharging of the capacitor is initiated at the instant when a given level is reached during the change in the opposite direction or at the instant when a field signal, for example, a field synchronizing signal present in an incoming video signal occurs. Discharging ends at the instant when the voltage across the capacitor reaches a fixed level, for example, because the capacitor is short-circuited. Embodiments of such circuits are described in U.S. Pat. Nos. 3,422,363 and 4,078,252.

If the first level considered is constant and if the means for reaching this level, for example, a charge current source for the capacitor, is active in the correct manner, or if the successive field synchronizing pulses each time occur at the correct instants, that is to say, if the successive intervals between these pulses each time have the nominal duration of a field period, then the generated sawtooth-shaped voltage has the correct variation. Particularly, if the incoming signals are suitable for display with interlacing, the sawtooth-shaped voltage is too. However, if a variation of the level or of the synchronizing instants occurs, for example, due to an instability at which the edges of the pulses occur irregularly (time jitter), then the level at which the subsequent voltage variation ends, whereafter the capacitor is again charged in this example, does not vary but the corresponding instant does, so that the sawtooth now commencing is not the correct one. This will generally result in an interlacing error.

SUMMARY OF THE INVENTION

It is an object of the invention to provide a circuit of the type described above in which the sawtooth generator adapts itself to the incoming signal for generating a voltage which is interlaced or not interlaced and in which the interlacing is not detrimentally influenced by a variation of the instants when changes of direction of the quantity of stored information are initiated. To this end the circuit according to the invention is characterized in that the sawtooth generator is also provided with a control loop for controlling the quantity of information stored in the storage element for rendering the mean value of the change of the quantity of stored information during the second part of the field period equal to the mean value of the change of the quantity of stored information during the first part of the field period.

The invention is based on the recognition that the interlacing error in the known circuits is caused by the fact that the change of quantity during the first part of the field period each time commences at a level which is independent of the value at the end of the immediately preceding first part so that the change of quantity during the second part varies when the final instant of the first part varies. Due to the measure according to the invention, the second change of quantity is fixed at a value which is independent of the instantaneous value of the voltage across the capacitor at the final instant of the immediately preceding first part of the field period so that the level at the commencement of the first part of the field period varies when the final instant of the first part varies and this in such a manner that the correct sawtooth is generated. As much information is applied to the storage element as there is depleted in one field period so that the correct control for the level of commencement of the sawtooth is obtained.

The control loop is preferably formed as a d.c. loop for maintaining the mean value of the quantity of information stored in the storage element constant, which loop comprises means which are coupled to the storage element at one end and to the second means at the other ends.

In one embodiment, the control loop comprises an integrator for integrating the quantity of information stored in the storage element with an integration period which is not shorter than one picture period, and a comparison stage coupled to the integrator for comparing the output signal of the integrator with a reference, while the output of the comparison stage is coupled to the second means.

A circuit, in which the storage element is a capacitor in which the first means comprises a charge current source and the second means comprises a discharge current source for the capacitor and in which the discharge current source is arranged in series with a switch controlled by a field blanking signal, may be formed in such a manner that the control loop is coupled to the discharge current source for controlling the discharge current intensity. For controlling the charge transport, either the current or the conductivity time of the switch may be controlled. For reasons of simplicity the former method is preferred.

A circuit according to the invention may be completed in a simple manner so that the sawtooth generator is also provided with a second control loop for performing the S-correction of the field deflection, the second control loop comprising means coupled to the storage element at one end and to the first means at the other end.

It will be noted that the invention can be used for generating both a sawtooth-shaped variation, i.e. a variation effected in a continuous way, and a staircase-shaped variation, with discrete variations being effected. In view of the large number of line periods in one field period, for example, 312.5 in accordance with the European television broadcasting standard, resulting in the height of the separate steps being very small as compared with the total amplitude of the staircase, the staircase can be considered by approximation as a sawtooth. dr

BRIEF DESCRIPTION OF THE DRAWING

The invention will now be described in greater detail, by way of example, with references to the accompanying drawings. In these drawings.

DESCRIPTION OF THE PREFERRED EMBODIMENT

Figure 1:
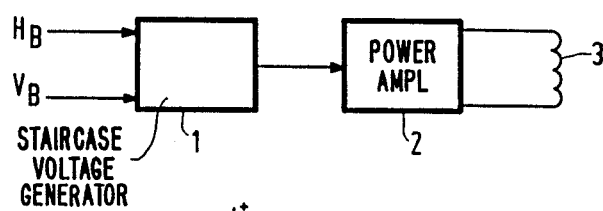
FIG. 1 is a block schematic diagram of a field deflection circuit in a picture display device, for example, a television receiver.

In FIG. 1, the reference numeral 1 denotes a staircase voltage generator. Generator 1 receives line blanking pulses $H_B$ and field blanking pulses $V_B$ which are generated in known manner in a line and a field time base, respectively, and which are substantially synchronous with the corresponding line and field synchronizing signals, respectively, present in an incoming video signal. The step-shaped voltage generated by generator 1 is applied to a power amplifier 2 which converts this voltage into a current. A field deflection coil 3 through which this current, the deflection current, flows is connected to amplifier 2. Amplifier 2 is formed as a linear amplifier in known manner, and particularly due to the use of negative feedback. Consequently, the field deflection current is substantially equal in shape to the step-shaped output signal of generator 1.

Figure 2:
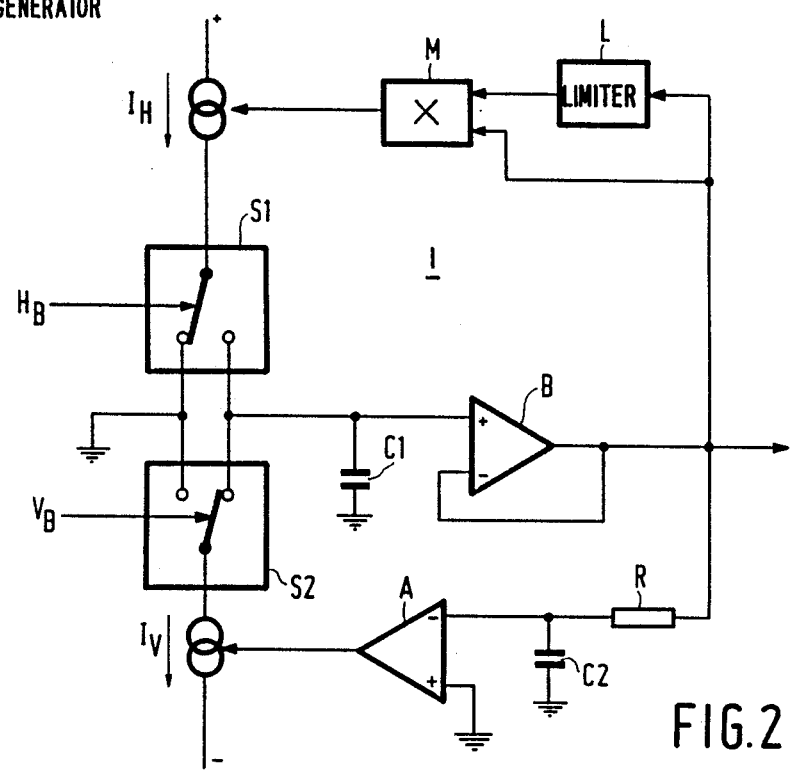
FIG. 2 is a detailed circuit diagram of a generator forming part of the circuit of FIG. 1.

FIG. 2 shows the staircase voltage generator 1 in greater detail. A first current source generating a current $I_H$ is connected to the master contact of a first switching stage S1, a selection contact of which is connected to ground and another selection contact of which is connected to a storage element in the form of a capacitor C1. A second current source generating a current $I_V$ is connected to the master contact of a second switching stage S2, a selection contact of which is connected to ground and another selection contact of which is also connected to capacitor C1. The other end of capacitor C1 is connected to ground. Stage S1 is operated by the line blanking signal $H_B$. During the occurrence of a line blanking pulse, source $I_H$ and capacitor C1 are connected together, while the current flows to the capacitor C1. The capacitor C1 is charged. During the subsequent line trace, source $I_H$ is connected to ground and the charge condition of and the voltage across capacitor C1 do not vary. Each line, the quantity of charge in and the voltage level of the capacitor are higher than the level of the preceding line at a value which is substantially fixed if the intensity of current $I_H$ and the duration of the line blanking pulse are fixed. In this manner, the desired step-shaped voltage is produced which is available via a buffer stage B as the output signal of generator 1.

The foregoing description applies to the field trace period during which switching stage S2 is in the state in which source $I_V$ is connected to ground. During the field trace period, horizontal lines are written in known manner on the display screen of a picture display tube (not shown) and this under the influence of a line deflection coil which is connected to a line deflection circuit of known type. Due to the action of the switch of FIG. 1 these lines are spaced at substantially equal vertical distances from one another.

Switching stage S2 is operated by the field blanking signal $V_B$. During the occurrence of a field blanking pulse, source $I_V$ and capacitor C1 are connected together, while the current flows from the capacitor C1. The capacitor C1 is discharged. Since a number of line blanking pulses occurs during the field blanking interval, charge is transferred to the capacitor also in this interval. The duration of the field blanking pulse and the value of current $I_V$, compared with that of current $I_H$, are, however, such that the voltage across capacitor C1 during the field blanking interval decreases to a low value, whereafter this value again increases in a step-like manner.

The output signal of the generator of FIG. 2 is applied to an integrator consisting of a resistor R and a capacitor C2. The junction point of resistor R and capacitor C2 is connected to an inverting input of a differential amplifier A, a non-inverting input of which is connected to a fixed reference potential, for example, ground, and an output of which is coupled to source $I_V$. The values of resistor R and capacitor C2 are chosen to be such that the integration period of the integrator thus formed is not shorter than 2 field periods, i.e. one picture period. In one embodiment, the integration period is approximately 10 field periods, i.e. approximately 200 ms. A voltage, which is the mean value of the output voltage of the generator, is present across capacitor C2. The difference between the voltages at the inputs of amplifier A is amplified thereby and the obtained output signal of the amplifier A controls the intensity of current $I_V$, hence the discharge rate of capacitor C1. Elements R, C2, A and $I_V$ thus form part of a d.c. control loop which adjusts itself in such a manner that the voltage across capacitor C2 has substantially the same value as the reference voltage, in this example zero, at the non-inverting input of amplifier A. This ensures that over a long time, capacitor C1 is charged as much on average as it is discharged. The control loop is only intended for the d.c. biassing of the generator and therefore acts very slowly.

The blanking signals which are applied to generator 1 originate from an incoming video signal which is suitable for the display of pictures with interlaced or non-interlaced fields. When receiving a non-interlaced signal the described generator supplied a non-interlaced staircase shaped voltage. The number of line periods per 2 field periods is in fact even, for example, 624 so that all successive steps have the same amplitude, which amplitude corresponds to 312 charges of capacitor C1. During the field trace period, the capacitor receives successively 312 charges and during the subsequent field retrace period, a charge corresponding to 312 charges is depleted. The lines written during one field on the display screen coincide with the lines written during the previous field.

In the case of an interlaced video signal the number of line blanking pulses, thus the number of charges of capacitor C1, is odd per 2 field periods, for example, 625 (European television broadcasting standard). During one field period, the capacitor successively receives 312 charges. In the subsequent field period, the number of charges is 313. If the field blanking intervals each time have the same duration and if the intensity of current $I_V$ is the same in one of these intervals and the subsequent interval, capacitor C1 is each time discharged as much. Due to the action of the control loop it is ensured that in one period of 635 line periods as many charges are applied as there are depleted. Consequently, in each field blanking interval a charge is depleted which corresponds to 312.5 charges during the field trace period. The second field considered, therefore, commences half a charge lower and ends half a charge higher than the first field.

Figure 3:
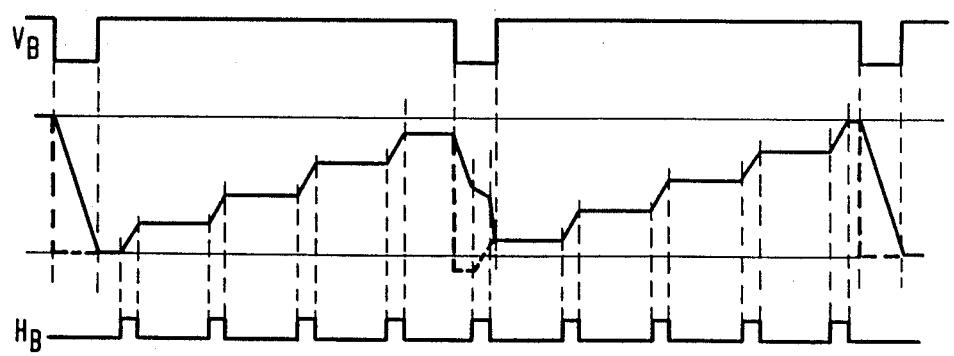
FIG. 3 shows a simplified waveform generated thereby.

The foregoing will be explained with reference to FIG. 3 in which, for the sake of simplicity, a signal with only 9 line periods per 2 fields is shown and in which the field blanking pulse has duration of one-half of a line period. It is apparent from FIG. 3 that capacitor C1 is charged 4 times during the first field period and 5 times during the second field period. Since, in this example, a line blanking pulse coincides with the second filed blanking pulse, the first line of the second field is half a step higher than the first line of the first field. For the purpose of comparison, FIG. 3 shows the step-shaped signal obtained in an infinitely short field blanking interval by means of broken lines from which it is apparent that the second field actually commences one-half step lower than the first field. The second field ends one-half step higher than the first field. Due to the action of the control loop, it is thus ensured that 2 successive fields do not commence at the same level, but that the level of commencement of a field each time depends on the final level of the previous field, the voltage drop during discharging being independent of the final level and the difference between two successive levels of commencement being automatically one-half step. The mutual position of the two pulse series $V_B$ and $H_B$ and the duration of the pulses $V_B$ is not important in this case because only the duration of the last line of the first field and of the first line of the second field are influenced thereby. The lines of a field are written on the display screen in between the lines of the previous field. It is found that the generator described adapts itself to the incoming signal and that, in accordance with this signal, it generates an interlaced or non-interlaced staircase shaped voltage.

The height of a step depends on the intensity of current $I_H$ and on the duration of the line blanking pulse. It is favorable to choose this height to be small so that the output voltage varies substantially linearly during the occurrence of the pulse. The linear output amplifier 2 then does not need to amplify signals whose frequency is higher than that which is strictly necessary. This implies that less stringent requirements are imposed on the bandwidth of amplifier 2. In addition, the amplitude of the output voltage of amplifier 2 is limited, which increases the efficiency of this amplifier. The amplitude of the field deflection current will not vary if current $I_H$ is constant and if the number of steps does not vary.

The staircase voltage generator, described with reference to FIG. 2, may be implemented with a provision for realizing the S-correction of the output voltage supplied. For this purpose, the height of the steps and thus the intensity of current $I_H$ are not maintained constant during the field period, but, on the contrary, the intensity undergoes a given desired variation. The output signal of generator 1 is applied to a limiter L and to a multiplier stage M which also receives the output signal of limiter L, and the output signal of multiplier stage M is applied to source $I_H$ for controlling the intensity of the current generated thereby.

In FIG. 4a, the broken-line curve represents the variation without S-correction of the output voltage of generator 1, which, with respect to the field frequency, for example, viewed on the display screen of an oscilloscope, is a linear sawtooth. Limiter L is formed as Schmitt trigger circuit or as a zero-crossing detector and its output signal (see FIG. 4b) is a square-wave voltage having a transition each time when the sawtooth of FIG. 4a crosses zero. FIG. 4c shows the signal obtained by means of stage M. It is apparent therefrom that the intensity of current $I_H$ is maximum in the middle of the trace period. In the first half of the trace period before the central instant, the intensity of current $I_H$ is increased from a given minimum value and, in the second half after the central instant, the intensity is reduced to the same minimum. FIG. 4c thus also represents the variation of current $I_H$. Consequently the output voltage of generator 1 undergoes the variation which is shown by means of a solid line in FIG. 4a, which solid line is higher in the first half of the field trace period and is lower in the second half than the broken line and which has the desired S shape. The steps of the step waveform are thus highest in the middle of the trace period. During the first half of the trace period, the steps regularly increase and during the second half, the steps decrease. This is shown for some lines in FIG. 4a.

Figure 4:
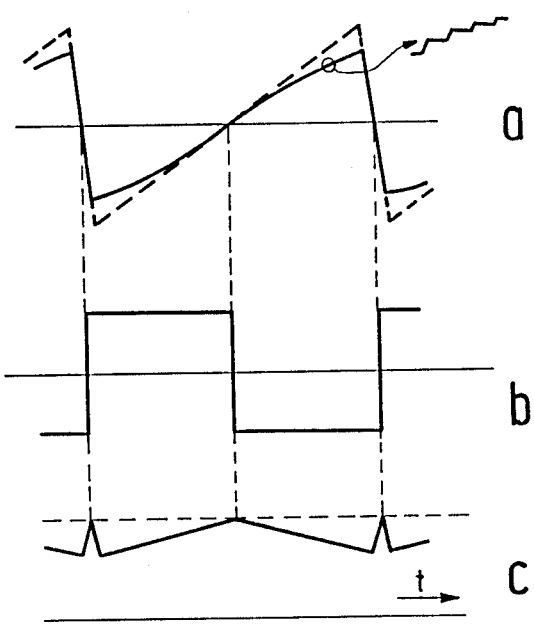
FIGS. 4a, 4b and 4c show waveforms to explain the S-correction.
Figure 7:
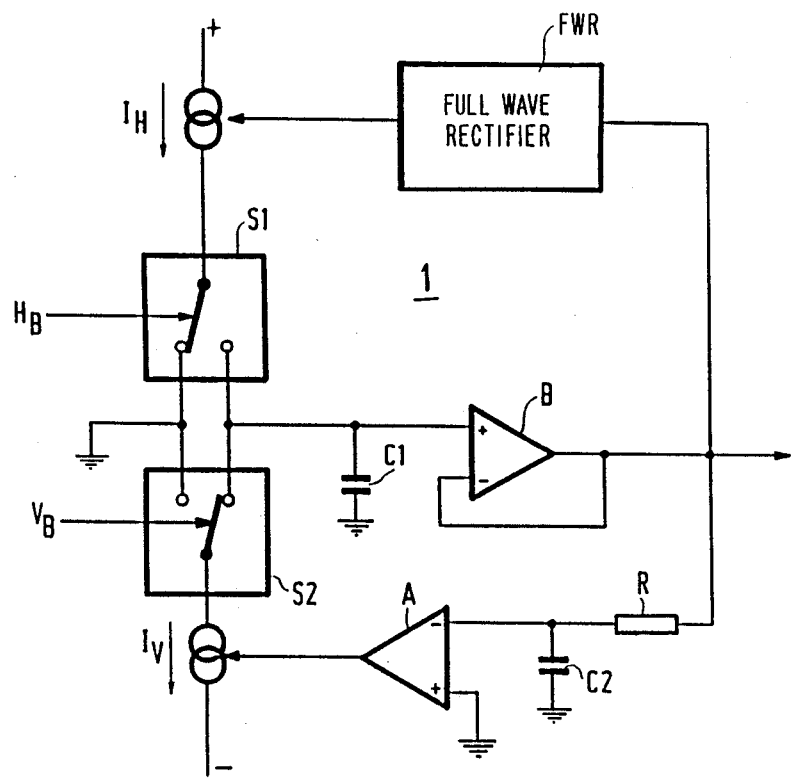
FIG. 7 shows another embodiment of the generator of FIG. 2.

As shown in FIG. 7, elements L and M may be replaced by a full-wave rectifier FWR which rectifies the output signal of generator 1. The output signal of the rectifier FWR, which is applied to source $I_H$ for its control, has the same shape as the signal of FIG. 4c. It will be noted that the waveforms of FIG. 4 apply to the case when the loop with elements L and M or the full-wave rectifier FWR is open. In the case of a closed loop the straight lines shown in FIGS. 4a and 4c are replaced by curved lines.

A generator has been described in the foregoing for generating a staircase-shaped voltage for the purpose of the field deflection with a control loop for fixing the d.c. component of the generated voltage and for controlling the discharge current of capacitor C1 during the field retrace period. Due to this measure, a staircase-shaped voltage is obtained which is interlaced or not interlaced depending on whether the incoming video signal is interlace or not interlaced. When receiving an interlaced signal, the first line of each field is written at a vertical distance from the first line of the previous field which is equal to one-half the vertical distance between two successive lines in one and the same field. This applied to a 2:1 interlacing. It will be evident that the generator generally adapts itself in a similar manner when receiving a video signal which is suitable for the display of fields with an n:1 interlacing wherein n is an integer. The output signal and, particularly, the interlacing are not detrimentally influenced by a variation of the signal $V_B$, for example, an instability at which the edges of this signal occur irregularly (time jitter). This is apparent from FIG. 3. If, for example, the leading edge of a pulse of signal $V_B$ occurs slightly earlier than is shown in FIG. 3, the only result is that the last line of the relevant field is slightly shorter.

Figure 5:
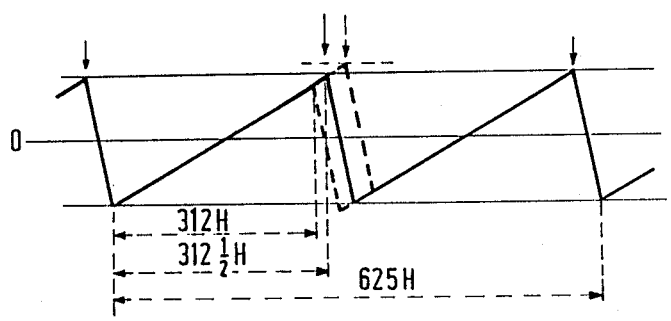
FIG. 5 shows the generated sawtooth-shaped voltage in the case of jitter.

The same applies if generator 1 does not generate a staircase-shaped voltage, which, in view of the large number of steps and the small height of each step in comparison with the total amplitude, can be considered by approximation as a sawtooth-shaped voltage, as well as if it generates a real sawtooth-shaped voltage, more specifically, because the integrator formed in FIG. 2 by source $I_H$ and capacitor C1 is not controlled by line-frequency pulses but is continuously operative. This implies that throughout the field trace period, stage S1 is in the state in which source $I_H$ is connected to capacitor C1. Stage S2 is operative as described above. Under these circumstances, the sawtooth-shaped voltage shown in FIG. 5 is generated, the S-correction being left out of consideration for the sake of simplicity. In FIG. 5, arrows denote the instants when the discharge of capacitor C1 is each time initiated upon the occurrence of the leading edges of the pulses of signal $V_B$. In the nominal case in which the instants are located at durations of 312.5 line periods after one another (interlaced 625 line standard), the solid line of Fig. 5 is obtained. This line is symmetrical with respect to the zero line. FIG. 5 shows, in a somewhat exaggerated way, the variation during the field retrace period in the case in which this period is initiated 312 line periods after the commencement of the trace period. This is denoted by broken lines. It appears from FIG. 5 that a leading edge of the sawtooth shown in the second place commences at a lower level than the edge of the first sawtooth, while the difference corresponds to half-a-line distance, and that the second sawtooth coincides with the second sawtooth which is generated in the nominal case of 312.5 line periods. It will be evident that the waveform of FIG. 5 is approximately the same as the waveform which would be visible on the display screen of an oscilloscope, also in the case when the generator 1 generates a staircase-shaped voltage with a large number of steps during a field period.

Figure 6:
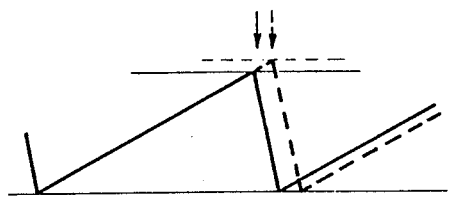
FIG. 6 shows, for comparison with FIG. 5, the sawtooth-shaped voltage generated in accordance with the prior art.

FIG. 5 shows, likewise by means of broken lines, the case in which discharging is initiated too late. Consequently the previous sawtooth has too long of a duration and therefore too large of an amplitude. Since the voltage drop during discharging does not depend on the level reached and has thus remained unchanged, the broken line ends at the sawtooth which corresponds to the nominal case. Thus, the same sawtooth as in the nominal case is generated. It is true that the new sawtooth commences too late, which is of no significance if the electron beam in the pciture display tube is suppressed at that instant, but there is no interlacing error. The field deflection is thus independent of the instant of commencement of the retrace period. FIG. 6 shows the same time diagram as FIG. 5 but in the case in which, according to the prior art, discharging of capacitor C1 ends when a fixed level is reached by the voltage across the capacitor, for example, because the capacitor is short-circuited during the retrace period. It appears from FIG. 6 that a different sawtooth is generated in the case of a different instant of commencement of the retrace period and consequently will generally result in an interlacing error. It will be noted that the foregoing also applies if the retrace is initiated not by the occurrence of a field signal, but rather because the sawtooth has reached a given level. If this level varies, then it is apparent from FIG. 5 that the same sawtooth is generated and it is apparent from FIG. 6 that a different sawtooth is generated.

Both when generating a staircase-shaped voltage and when generating a real sawtooth-shaped voltage in the circuit of FIG. 2, the discharge current $I_V$ is controlled by means of a direct voltage control for maintaining the d.c. component of the generated voltage constant. It will be evident to those skilled in the art that in contract thereto, the charge current $I_H$ may be influenced by the d.c. control. It will also be evident that the terms "charging" and "discharging" which are dependent on the chosen sign of the charge and on the chosen reference potential are interchangeble.

We claim:

1. A circuit for field deflection in a picture display device, comprising a generator for generating an essentially sawtooth-shaped variation, a power amplifier coupled to the generator and a field deflection coil connected to an output of the amplifier, the sawtooth generator being provided with a storage element, first means for causing a change of a quantity of information stored in the storage element in one direction during a first part of a field period and second means for causing a change of said quantity in an opposite direction during a remaining second part of the field period so that the essentially sawtooth-shaped variation is produced, characterized in that the sawtooth generator also comprises a first control loop for controlling the quantity of information stored in the storage element for rendering a mean value of the change of said quantity during the second part of the field period equal to a mean value of the change of said quantity during the first part of the field period, and a second control loop for performing an S-correction of the field deflection, said second control loop comprising means which are coupled to the storage element at one end and to the first means at another end.

2. A circuit as claimed in claim 1, wherein the storage element is a capacitor, the first means comprises a charge current source and the second means comprises a discharge current source for the capacitor, and wherein the discharge current source is arranged in series with a switch controlled by a field blanking signal, characterized in that the control loop is coupled to the discharge current source for controlling an intensity of the discharge current.

3. A circuit as claimed in claim 2, characterized in that the charge current is maximum in a middle of the first part of the field period and has substantially a same minimum value at a commencement and an end of said first part.

4. A circuit as claimed in claim 3, characterized in that the second control loop comprises a limiter coupled to the capacitor and a multiplier stage coupled to both the limiter and the capacitor, an output of the multiplier stage being coupled to the charge current source for controlling an intensity of the charge current.

5. A circuit as claimed in claim 3, characterized in that the second control loop comprises a full-wave rectifier coupled to the capacitor, an output of the rectifier being coupled to the charge current source for controlling an intensity of the charge current.

6. A circuit as claimed in claim 1, characterized in that the quantity of information in said one direction is maximum in a middle of the first part of the field period and has substantially a same minimum value at a commencement and an end of said first part.

7. A circuit as claimed in claim 1, characterized in that the second control loop comprises a limiter coupled to the capacitor and a multiplier stage coupled to both the limiter and the capacitor, an output of the multiplier stage being coupled to the first means for controlling the quantity of information to be stored in the storage element.

8. A circuit as claimed in claim 1, characterized in that the second control loop comprises a full-wave rectifier coupled to the capacitor, an output of the rectifier being coupled to the first means for controlling the quantity of information to be stored in the storage element.

* * * * *